(12) United States Patent
Andrei et al.

(10) Patent No.: US 11,870,224 B2
(45) Date of Patent: Jan. 9, 2024

(54) HIGH-VOLTAGE JUNCTION BOX FOR AN ELECTRICALLY DRIVEN VEHICLE AND ELECTRICALLY DRIVEN VEHICLE

(71) Applicant: Vitesco Technologies GmbH, Regensburg (DE)

(72) Inventors: Sorin Andrei, Munich (DE); Eduard Iosif Trif, Munich (DE)

(73) Assignee: Vitesco Technologies GmbH, Regensburg (DE)

( * ) Notice: Subject to any disclaimer, the term of this patent is extended or adjusted under 35 U.S.C. 154(b) by 126 days.

(21) Appl. No.: 17/554,098

(22) Filed: Dec. 17, 2021

(65) Prior Publication Data
US 2022/0200255 A1  Jun. 23, 2022

(30) Foreign Application Priority Data
Dec. 17, 2020 (EP) .................................... 20465601

(51) Int. Cl.
| H02G 3/00 | (2006.01) |
| H02G 3/08 | (2006.01) |
| H02G 5/06 | (2006.01) |
| H05K 7/20 | (2006.01) |

(52) U.S. Cl.
CPC ............... *H02G 3/086* (2013.01); *H02G 5/06* (2013.01); *H05K 7/20854* (2013.01)

(58) Field of Classification Search
CPC ....... H02G 3/086; H02G 5/06; H05K 7/20854
See application file for complete search history.

(56) References Cited

U.S. PATENT DOCUMENTS

| 1,213,599 A | 1/1917 | Dow |
| 2,936,015 A | 5/1960 | Rapata |
| 4,006,949 A | 2/1977 | Keller |

(Continued)

FOREIGN PATENT DOCUMENTS

| DE | 3624160 A1 | 1/1988 |
| DE | 102012007996 A1 | 10/2013 |

(Continued)

OTHER PUBLICATIONS

DE 102014201356 A1; English Translation; published in 2015 (Year: 2015).*

*Primary Examiner* — Pete T Lee
(74) *Attorney, Agent, or Firm* — Laurence A. Greenberg; Werner H. Stemer; Ralph E. Locher

(57) ABSTRACT

A high-voltage junction box for an electrically driven vehicle includes a housing part with at least one mounting hole, a contactor mechanically connected to the housing part by at least one fastening element extending through a through hole in the contactor into the mounting hole, and a bus bar having a first contact area and a second contact area. The first contact area is electrically and mechanically connected to the contactor and the second contact area is electrically and mechanically connected to a connector. A tolerance compensation element suitable to compensate for tolerance variations in a distance or space between the housing part and the contactor is mounted in the at least one mounting hole. An electrically driven vehicle with a charging unit including a high-voltage junction box is also provided.

8 Claims, 1 Drawing Sheet

(56) References Cited

U.S. PATENT DOCUMENTS

| | | | |
|---|---|---|---|
| 5,065,490 A * | 11/1991 | Wivagg | G21C 11/08 |
| | | | 29/402.09 |
| 5,704,752 A * | 1/1998 | Logerot | F16B 19/1081 |
| | | | 411/21 |
| 6,206,726 B1 | 3/2001 | Takahashi et al. | |
| 11,052,784 B2 | 7/2021 | Mensch et al. | |
| 11,193,517 B2 * | 12/2021 | McClure | F16B 19/109 |
| 2006/0036362 A1 | 2/2006 | Keda et al. | |
| 2007/0247818 A1 | 10/2007 | Canfield et al. | |
| 2014/0273554 A1 | 9/2014 | Sugimoto | |
| 2017/0141367 A1 | 5/2017 | Kim et al. | |
| 2018/0102635 A1 | 4/2018 | Tashiro et al. | |
| 2019/0297720 A1 * | 9/2019 | Fujimura | H05K 1/0204 |
| 2021/0289651 A1 | 9/2021 | Klanke et al. | |

FOREIGN PATENT DOCUMENTS

| | | |
|---|---|---|
| EP | 2696456 A1 | 2/2014 |
| EP | 3168898 A1 | 5/2017 |
| WO | 2018006892 A1 | 1/2018 |
| WO | 2020193466 A1 | 10/2020 |

\* cited by examiner

HIGH-VOLTAGE JUNCTION BOX FOR AN ELECTRICALLY DRIVEN VEHICLE AND ELECTRICALLY DRIVEN VEHICLE

CROSS-REFERENCE TO RELATED APPLICATION

This application claims the priority, under 35 U.S.C. § 119, of European Patent Application EP20465601, filed Dec. 17, 2020; the prior application is herewith incorporated by reference in its entirety.

FIELD AND BACKGROUND OF THE INVENTION

The present invention relates to a high-voltage junction box for an electrically driven vehicle with a charging unit. The present invention further relates to an electrically driven vehicle including such a high-voltage junction box.

High-voltage junction boxes usually connect an external power source to the vehicle battery in a charging event, in particular in a DC-charging event. They include a contactor, which might be a relay and which can couple and decouple the external power source and the vehicle battery. In case of an overvoltage, the contactor serves to disconnect the charger from the battery to prevent damage to electronic components.

Typically, the contactor is fixed to a housing of the junction box by screws. However, the tolerances of the contactor and other elements of the junction box, in particular of a connector and a bus bar, are comparatively large. That may result in considerable gaps between e.g. the housing and the mounting surface of the contactor and therefore in high tensions applied to the connector. Those tensions can be passed on to the connector, which is mechanically and electrically connected to the contactor by the bus bar.

While some of those tolerances may be balanced during the assembly, it is not always possible to compensate tolerances in the case of a repair. The contactor is a rather vulnerable component, which might be replaced during the lifetime of the vehicle. In that case, the replacement contactor may have dimensions differing from those of the original one by several millimeters due to manufacture tolerances. Those tolerances cannot be balanced without applying tension to the contactor, the bus bar and the connector.

SUMMARY OF THE INVENTION

It is accordingly an object of the invention to provide a high-voltage junction box for an electrically driven vehicle and an electrically driven vehicle, which overcome the hereinafore-mentioned disadvantages of the heretofore-known junction boxes and vehicles of this general type and in which components such as a contactor are easily replaceable without damage to other components.

With the foregoing and other objects in view there is provided, in accordance with the invention, a high-voltage junction box for an electrically driven vehicle, comprising a housing part with at least one mounting hole. The junction box further includes a contactor with a through-hole, the contactor is mechanically connected to the housing part by at least one fastening element extending through the through-hole into the mounting hole. The junction box further includes at least one bus bar having a first contact area and the second contact area, wherein the first contact area is electrically and mechanically connected to the contactor and the second contact area is electrically and mechanically connected to a connector or another component. A tolerance compensation element suitable to compensate for tolerance variations (size variations, dimension variations) in the distance between the housing element and the contactor is provided and mounted in the at least one mounting hole.

The high-voltage junction box has the advantage, that mounting a tolerance compensation element in the mounting hole and therefore between the housing and the contactor, makes it possible to balance tolerances (variations in size or dimensions) of the contactor with respect to the housing. The result is a fixed position of the contactor, in particular of some of its surfaces, with respect to the housing.

The position of the bus bar, which might be mechanically and electrically connected to an upper side of the contactor, is therefore fixed with respect to the housing and independent of tolerances of the contactor. Therefore, no tensions will be induced in the bus bar and the connector or the other component when the contactor is replaced, even if the new component has different dimensions.

The housing part is a part of the housing of the junction box. The housing may be in one part or may have several parts joined together.

A bus bar is a strip for high current power distribution in an electric vehicle and usually includes copper, steel and/or aluminum. The bus bar usually does not include an insulating coating but is self-supporting or supported by insulated pillars and may be effectively cooled by air or another coolant. In a junction box, the bus bar transmits power from an external source through the contactor to a connector or to another high voltage electric component, e.g. a power measuring unit.

According to an embodiment of the invention, the mounting hole extends into a tubular hollow protrusion of the housing part. The tubular hollow protrusion may be formed to accommodate the fastening element, preferably a screw, and the tolerance compensation element.

Tolerance compensation elements are known in the art. There are different types of tolerance compensation elements which might differ e.g. in the way they are fixed in the mounting hole. Typically, they include a left-hand thread on their outer side and a frictional connection element for establishing a frictional connection between the tolerance compensation element and the screw.

According to an embodiment, the tolerance compensation element can be placed in the mounting hole during the assembly. Subsequently, the contactor is placed in its mounting position with respect to the housing part, in which the through-hole is aligned with the mounting hole in the housing part. In this position, a screw can be placed in the through-hole extending into the mounting hole with the tolerance compensation element. While the screw is being screwed in, the tolerance compensation element is screwed out due to its left-hand thread and due to the frictional connection between the tolerance compensation element and the screw.

The tolerance compensation element is screwed out of the mounting hole until it is in contact with the contactor. Subsequently, the forces exerted by the screw through the contactor on the tolerance compensation element are larger than the frictional forces of the frictional connection and the screw can be screwed in with a suitable tightening torque.

The result is a connection between the contactor and the housing part free from distortion.

According to an embodiment of the invention, the tolerance compensation element includes a shoulder (collar) facing outwards from the mounting hole, the shoulder extending radially over an edge of the mounting hole, wherein the shoulder is in contact with the perimeter region of the through-hole when the contactor is connected to the housing part. According to this embodiment, the shoulder contacts the contactor when the screw has been partially screwed in and the tolerance compensation element has been screwed out to a maximum extent.

According to an embodiment, the contactor includes two mounting ears, each having a through-hole for mechanically connecting the contactor to the housing part. The mounting ears provide a position for the through holes. If the contactor housing is made of a plastic material, a metal bushing may be provided in the mounting ears and the through-hole may be positioned in the bushing in order to provide a reliable and robust connection between the contactor and the housing.

According to an aspect of the invention, the bus bar has a heat dissipation area disposed between the first contact area and the second contact area, the heat dissipation area being in thermal contact with a cooling element.

The advantage is that the bus bar, which will be heated by high currents during charging, may be cooled effectively. A heat conducting paste may be placed between the heat dissipation area of the bus bar and the cooling element. While the heat conducting paste is soft during the first assembly, it may harden over time and is typically not ductile when the contactor has to be replaced at a later time. Therefore, the tolerance compensation between the contactor and the housing is advantageous for an effective cooling of the bus bar as well not allowing the movement of the busbar and avoiding the risk of detaching from the cooling surface.

With the objects of the invention in view, there is concomitantly provided an electrically driven vehicle provided with a charging unit comprising the above described high voltage junction box.

Other features which are considered as characteristic for the invention are set forth in the appended claims.

Although the invention is illustrated and described herein as embodied in a high-voltage junction box for an electrically driven vehicle and an electrically driven vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
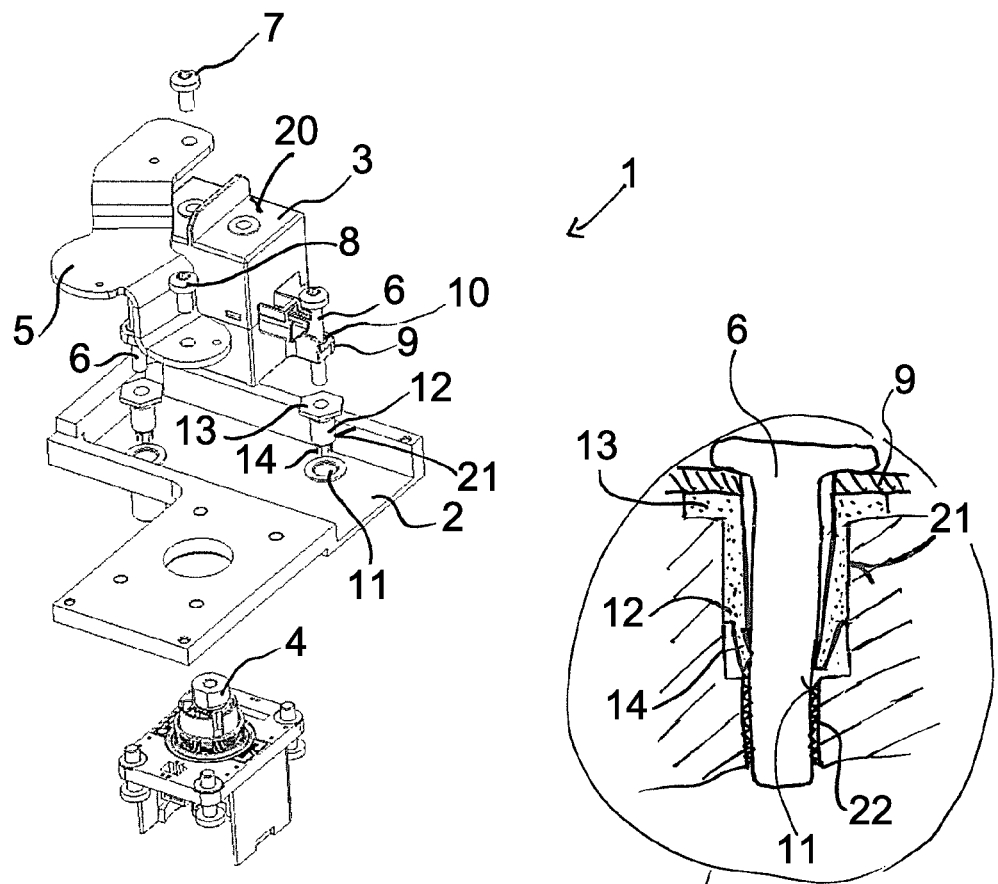
FIG. 1 is a diagrammatic, perspective view of parts of a junction box of an electric vehicle according to an embodiment of the invention.

Referring now to the figures of the drawings in detail and first, particularly, to FIG. 1 thereof, there is seen a part of a high-voltage junction box 1 for an electrically driven vehicle. The junction box 1 includes a housing, of which a housing part 2 is shown. The junction box 1 further includes a contactor 3 for coupling an external power source to a vehicle battery and decoupling it in case of an overvoltage. The junction box 1 further includes a connector 4 for connection to a vehicle battery and a bus bar 5 for electrical connection of the contactor 3 and the connector 4. Typically, the junction box further includes a second bus bar which is not shown herein. Hence, the junction box 1 connects the vehicle battery to an external charging device, in which the contactor 3 is placed towards the external charging device and the connector 4 towards the battery.

The contactor 3 is fixed to the housing part 2 by two screws 6. The bus bar 5 is fixed to the contactor 3 by a screw 7 and to the connector 4 by a screw 8.

The contactor 3 has comparatively large tolerances. Its mounting between the housing part 2 on one hand and the bus bar 5 on the other hand might therefore lead to tensions which might damage the connector 4 and/or weaken the electrical and thermal contacts. Therefore, tolerance compensation elements 12 are used to compensate tolerance variations of the contactor 3.

Figure 2:
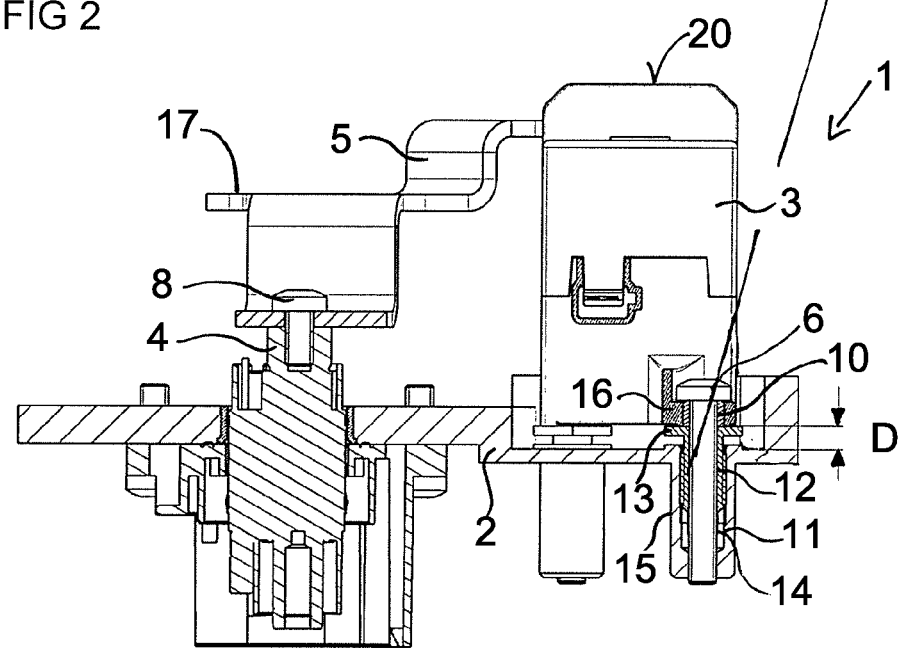
FIG. 2 is a vertical-sectional view of the junction box according to FIG. 1 and an enlarged portion thereof.

The mounting of the tolerance compensation elements 12 is described with respect to the FIGS. 1 and 2. The contactor 3 has two mounting ears 9, which protrude from opposite sides of the contactor 3. Each mounting ear 9 has a bushing 16 with a through-hole 10 to accommodate the screw 6. The housing part 2 has two mounting holes 11 to accommodate the screws 6. The mounting holes 11 are allocated in a tubular hollow protrusion 15 of the housing part 2 which can be best seen in FIG. 2. The screw 6 has a right-hand thread.

The tolerance compensation element 12 is substantially cylindrical with an inner side and an outer side and has a shoulder 13 extending radially outwards from the end of the tolerance compensation element 12 facing towards the contactor 3. The tolerance compensation element 12 includes a left-hand thread on its outer side 21 and a through-hole on its inner side.

This is shown in more detail in the enlarged portion of FIG. 2, which shows one exemplary embodiment with a suitable tolerance compensation element known in the art. However, other tolerance compensation elements of a different construction may be used instead. The inner side of the housing 2 has a right-hand thread 22 interacting with the right-hand thread of the screw 6.

The tolerance compensation element 12 has at least one frictional connection element 14 on its end facing away from the contactor 3. In the embodiment shown in FIGS. 1 and 2, the frictional connection element 14 is formed by a number of axial projections which are preloaded to be pressed against the screw 6.

During the assembly of the junction box 1, the contactor 3 is placed in its mounting position on the housing part 2, where the through-holes 10 are aligned with the mounting holes 11. A tolerance compensation element 12 is placed in each mounting hole 11. Subsequently, a screw 6 is inserted into each through-hole 10 and screwed in to extend into the mounting hole 11 with the tolerance compensation element 12. When the screw 6 is screwed in, a frictional connection between the screw 6 and the tolerance compensation element 12 is established by using the frictional connection element 14.

When the screw 6 is screwed in further, the tolerance compensation element 12 is screwed out. The tolerance compensation element 12 is screwed out while the screw 6 is screwed in until the shoulder 13 of the tolerance compensation element 12 contacts an underside of the contactor 3.

When the screw 6 is screwed in further, the vertical force exerted by the underside of the contactor 3 on the tolerance compensation element 12 exceeds the frictional force between the tolerance compensation element 12 and the screw 6 and the frictional connection between those is broken. Consequently, the tolerance compensation element 12 is no longer fixed with respect to the screw 6 and the screw 6 can be screwed in further up to an end position. When this position is reached, a distance D might remain between the housing part 2 and the contactor 3, the distance D depending on the tolerances (size variations, dimension variations) of the contactor 3. Due to the tolerance compensation element 12, there is a stable connection between the contactor 3 and the housing 2.

This has the advantage, that an upper side 20 of the contactor 3 is in a defined position which is independent of the tolerances of the contactor 3. Therefore, the bus bar 5 is also mounted in a defined position and a heat dissipation area 17 of the bus bar 5 is also in a defined position. Therefore, connections between the contactor 3 and the bus bar 5 as well as between the bus bar 5 and a cooling element as well as between the bus bar 5 and the connector 4 are independent of tolerances of the contactor 3 and remain unchanged and without tension even in the case of a replacement of the contactor 3.

The invention claimed is:

1. A high-voltage junction box for an electrically driven vehicle, the high-voltage junction box comprising:
    a housing part with at least one mounting hole;
    a contactor with a through-hole;
    at least one fastening element extending through said through hole into said at least one mounting hole, said at least one fastening element mechanically connecting said contactor to said housing part;
    a bus bar having a first contact area and a second contact area, said first contact area being electrically and mechanically connected to said contactor and said second contact area configured to be electrically and mechanically connected to a connector; and
    a tolerance compensation element disposed in said at least one mounting hole, said tolerance compensation element being suitable to compensate for tolerance variations in a distance between said housing part and said contactor, said tolerance compensation element including, on an outer surface of said tolerance compensation element, a thread configured to drive at least a portion of said tolerance compensation element out of said at least one mounting hole by an insertion of the at least one fastening element into said at least one mounting hole until said tolerance compensation element contacts said contactor.

2. The high-voltage junction box according to claim 1, wherein said housing part has a tubular hollow protrusion, and said at least one mounting hole extends into said tubular hollow protrusion.

3. The high-voltage junction box according to claim 2, wherein said fastening element is a screw, and said tolerance compensation element includes a cylindrically shaped part with an outer side, an inner side and at least one frictional connection element for establishing a frictional connection to said screw.

4. A high-voltage junction box for an electrically driven vehicle, the high-voltage junction box comprising:
    a housing part with at least one mounting hole;
    a contactor with a through-hole;
    at least one fastening element extending through said through hole into said at least one mounting hole, said at least one fastening element mechanically connecting said contactor to said housing part;
    a bus bar having a first contact area and a second contact area, said first contact area being electrically and mechanically connected to said contactor and said second contact area configured to be electrically and mechanically connected to a connector;
    a tolerance compensation element disposed in said at least one mounting hole, said tolerance compensation element being suitable to compensate for tolerance variations in a distance between said housing part and said contactor;
    said housing part having a tubular hollow protrusion, and said at least one mounting hole extending into said tubular hollow protrusion;
    said fastening element is a screw, and said tolerance compensation element includes a cylindrically shaped part with an outer side, an inner side and at least one frictional connection element for establishing a frictional connection to said screw; and
    said screw has a right-hand thread and said outer side of said tolerance compensation element has a left-hand thread.

5. The high-voltage junction box according to claim 1, wherein:
    said at least one mounting hole has an edge;
    said through hole has a perimeter region;
    said tolerance compensation element includes an end and a shoulder protruding from said end and facing outwards from said at least one mounting hole;
    said shoulder extends radially over said edge of said at least one mounting hole; and
    said shoulder is in contact with said perimeter region of said through hole when said contactor is connected to said housing part.

6. The high-voltage junction box according to claim 1, wherein said contactor includes two mounting ears, said mounting ears each having a respective through hole for mechanically connecting said contactor to said housing part.

7. The high-voltage junction box according to claim 1, wherein said bus bar includes a heat dissipation area disposed between said first contact area and said second contact area, said heat dissipation area configured to be in thermal contact with a cooling element.

8. An electrically driven vehicle with a charging unit, comprising a high-voltage junction box according to claim 1.

* * * * *